(12) United States Patent
Hanqiuhua et al.

(10) Patent No.: US 11,456,174 B2
(45) Date of Patent: Sep. 27, 2022

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hanqiuhua, Shanghai (CN); Zhang Hai Yang, Shanghai (CN); Ji Shi Liang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 81 days.

(21) Appl. No.: 16/861,744

(22) Filed: Apr. 29, 2020

(65) Prior Publication Data
US 2021/0183655 A1 Jun. 17, 2021

(30) Foreign Application Priority Data
Dec. 17, 2019 (CN) .......................... 201911298801.X

(51) Int. Cl.
*H01L 21/033* (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............ H01L 21/0332; H01L 21/0335; H01L 21/0337; H01L 21/0338; H01L 21/3086
See application file for complete search history.

(56) References Cited

U.S. PATENT DOCUMENTS

2019/0378718 A1\* 12/2019 Chen .................... G03F 7/2004

\* cited by examiner

*Primary Examiner* — Walter H Swanson
(74) *Attorney, Agent, or Firm* — Crowell & Moring, L.L.P.

(57) ABSTRACT

A semiconductor structure and a formation method thereof are provided. One form of the formation method includes: providing a substrate; forming a plurality of discrete mandrel layers on the substrate, wherein a minimum pitch between mandrel layers of the plurality of mandrel layers is a second pitch, and a minimum pitch between each of other pitches is a first pitch; forming second side wall covering layer between the mandrel layers having the second pitch; removing a first side wall covering layer, and maintaining the second side wall covering layer; forming a third side wall covering layer on an exposed side wall of the mandrel layer; removing the mandrel layer and the second side wall covering layer; and etching the substrate by using the third side wall covering layer as a mask to form a desired pattern. In embodiments and implementations of the present disclosure, the mandrel layer and the second side wall covering layer are configured to define a pitch between the third side wall covering layers. An extension direction perpendicular to the side wall of the mandrel layer is a lateral direction. The pitch between the third side wall covering layers can be adjusted by changing lateral dimensions of the mandrel layer and the second side wall covering layer according to process requirements. Therefore, diversified desired patterns having non-uniform pitches are formed more easily, and further, the flexibility and the general applicability of the semiconductor structure are improved favorably.

15 Claims, 5 Drawing Sheets

SEMICONDUCTOR STRUCTURE AND FORMATION METHOD THEREOF

BACKGROUND

Related Applications

The present application claims priority to Chinese Patent Appln. No. 201911298801.X, filed Dec. 17, 2019, the entire disclosure of which is hereby incorporated by reference.

BACKGROUND

Technical Field

Embodiments and implementations of the present disclosure relate to the field of semiconductor manufacturing, and, in particular, to a semiconductor structure and a formation method thereof.

Related Art

Photolithography is a common-used patterning method, and it is a most critical mass-production technology in a industrial semiconductor manufacture. With the continuous shrinking of semiconductor technology nodes, a self-aligned double patterning (SADP) method has become a popular patterning method in recent years, which can increase the density of patterns formed on a substrate to further reduce a pitch of two adjacent patterns, so that the photolithographic process overcomes the limit of the photolithographic resolution.

With the continuous shrinkage of the critical dimensions (CDs) of patterns, a self-aligned quadruple patterning (SAQP) method has emerged at the right moment. The density of the patterns formed on the substrate by the SADP method is twice that of the patterns formed on the substrate by the photolithographic process, i.e., a ½ pitch can be obtained. The density of the patterns formed on the substrate by the SAQP method without changing the current photolithography (i.e., the size of a photolithographic window is not changed) is four times that of the patterns formed on the substrate by the photolithographic process, i.e., a ¼ pitch can be obtained. Therefore, the density of a semiconductor integrated circuit can be greatly increased, and the CDs of the patterns are reduced, which is conducive to improving the device performance.

SUMMARY

To address the problem, embodiments and implementations of the present disclosure provide a semiconductor structure and a formation method thereof, so as to improve the flexibility and the general applicability of the semiconductor structure.

To address the foregoing problem, one form of the present disclosure provides a formation method of a semiconductor structure, including: providing a substrate; forming a plurality of discrete mandrel layers on the substrate, where a minimum pitch between the mandrel layers of a plurality of mandrel layers is a second pitch, and a minimum pitch between each of other pitches is a first pitch; forming a first side wall covering layer on a side wall of the mandrel layer, and merging the first side wall covering layers formed between the mandrel layers having the second pitch together to form a second side wall covering layer; removing the first side wall covering layer, and maintaining the second side wall covering layer; forming a third side wall covering layer on the exposed side wall of the mandrel layer; removing the mandrel layer and the second side wall covering layer; and etching the substrate by using the third side wall covering layer as a mask to form a desired pattern.

In some implementations, the mandrel layer includes a middle mandrel layer and cladding layers located on a top wall and a side wall of the middle mandrel layer.

In some implementations, a thickness of the cladding layer ranges from 2 nm to 5 nm.

In some implementations, the step of forming the mandrel layer includes: providing an initial mandrel layer, and oxidizing a side wall and a top wall of the initial mandrel layer to form an oxide layer, where the oxide layer serves as the cladding layer, and the remaining initial mandrel layer serves as the middle mandrel layer.

In some implementations, an extension direction perpendicular to the side wall of the mandrel layer is a lateral direction. In the step of oxidizing the side wall and the top wall of the initial mandrel layer to form the cladding layer, the initial mandrel layer of one (1) unit lateral dimension is oxidized to form the cladding layer of 1.1 to 1.3 unit lateral dimensions.

In some implementations, the oxidizing process includes a thermal oxidation process or an in-situ steam generation process.

In some implementations, a material of the cladding layer includes silicon oxide.

In some implementations, the step of removing the mandrel layer and the second side wall covering layer includes: removing the cladding layer on the top wall of the middle mandrel layer; removing the middle mandrel layer and the second side wall covering layer using a dry etching process after the cladding layer on the top wall of the middle mandrel layer is removed; and removing the remaining cladding layer after the middle mandrel layer and the second side wall covering layer are removed.

In some implementations, in the step of removing the middle mandrel layer and the second side wall covering layer using the dry etching process, etching gas used includes $NF_3$ and $H_2$.

In some implementations, the step of forming the first side wall covering layer includes: conformally covering the mandrel layer and the substrate of a side portion of the mandrel layer with a first side wall covering material layer. In some implementations double of a thickness of the first side wall material covering layer is larger than the second pitch and less than the first pitch, and the first side wall covering material layer located on the side wall of the mandrel layer serves as the first side wall covering layer. Further, the step of removing the first side wall covering layer and maintaining the second side wall covering layer may include: etching the first side wall covering material layer using an isotropic etching process to remove the first side wall material covering layer outside the mandrel layers having the second pitch.

In some implementations, the isotropic etching process includes a wet etching process or an isotropic plasma etching process.

In some implementations, the step of forming the third side wall covering layer on the exposed side wall of the mandrel layers includes: conformally covering the mandrel layer, the second side wall covering layer, and the substrate between the mandrel layer and the second side wall covering layer with a third side wall covering material layer; removing the third side wall covering material layer on top walls of the mandrel layer and the second side wall covering layer, and on the substrate between the mandrel layers. The remaining third side wall covering material layer located on the side wall of the mandrel layer serves as the third side wall covering layer.

In some implementations, the third side wall covering material layer is formed using a chemical vapor deposition process or an atomic layer deposition process.

In some implementations, materials of the middle mandrel layer and the second side wall covering layer each include one or two of silicon and amorphous silicon.

In some implementations, a material of the third side wall covering layer includes one or more of silicon nitride, silicon oxynitride, silicon carbide, nitrogen silicon carbide, boron nitride, silicon boron nitride or carbon silicon boron nitride.

Another form of the present disclosure further provides a semiconductor structure, including: a substrate; a plurality of mandrel layers, discretely disposed on the substrate, where a minimum pitch between the mandrel layers of the plurality of mandrel layers is a second pitch, and a minimum pitch between each of other pitches is a first pitch; a second side wall covering layer, filling between the mandrel layers having the second pitch; and a third side wall covering layer, located on a side walls of the mandrel layer.

In some implementations, the mandrel layer includes a middle mandrel layer and cladding layers located on a top wall and a side wall of the middle mandrel layer.

In some implementations, a material of the cladding layer includes silicon oxide.

In some implementations, a material of the middle mandrel layer includes at least one of silicon or amorphous silicon.

In some implementations, a material of the second side wall covering layer includes at least one of silicon or amorphous silicon.

Compared with the prior art, the technical solutions of the embodiments and implementations of the present disclosure have the following advantages:

In the embodiments and implementations of the present disclosure, the third side wall covering layer is an etching mask, and the mandrel layer and the second side wall covering layer are configured to define a pitch between the third side wall covering layers, thus defining a pitch of the etching masks. In the embodiments and implementations of the present disclosure, the extension direction perpendicular to the side wall of the mandrel layer is the lateral direction. The pitch between the third side wall covering layers can be adjusted by changing the lateral dimensions of the mandrel layer and the second side wall covering layer according to process requirements. The substrate is etched by using the third side wall covering layer serving as the mask, so that diversified desired patterns having non-uniform pitches are formed more easily, and further, the flexibility and the general applicability of the semiconductor structure are improved favorably.

DETAILED DESCRIPTION

Devices formed at present still have the problem of poor performance. Reasons for the poor performance of the devices are analyzed now in combination with a formation method of a semiconductor structure.

FIG. 1 to FIG. 5 illustrate schematic structural diagrams corresponding to various steps in a formation method of a semiconductor structure.

Figure 1:
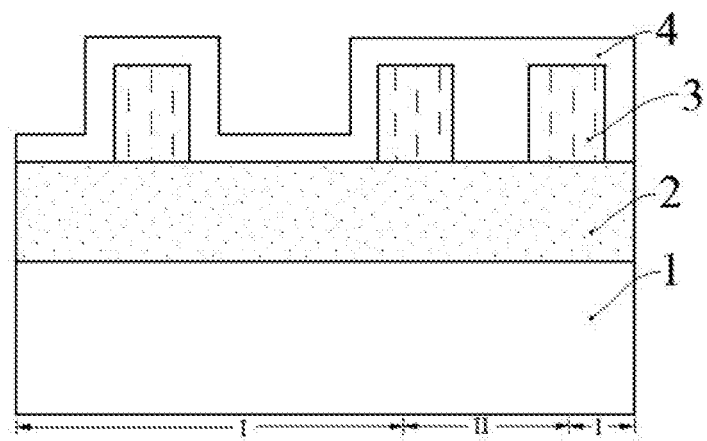
FIG. 1 to FIG. 5 illustrate schematic structural diagrams corresponding to various steps in a formation method of a semiconductor structure.

As shown in FIG. 1, a substrate 1 is provided. The substrate 1 includes first regions I and a second region II. The substrate 1 in the first regions I is configured to form desired patterns. A pitch between desired patterns to be formed in the second region II is larger than a pitch between the desired patterns to be formed in the first regions I. A bottom mandrel material layer 2 and a top mandrel layer 3 located on the bottom mandrel material layer 2 are formed on the substrate 1. The top mandrel layers 3 and the bottom mandrel material layer 2 exposed by the top mandrel layers 3 are conformally covered with a first side wall covering material layer 4.

In the process of forming the first side wall covering material layer 4 by conformal coverage, when the first side wall covering material layer 4 is thick enough, the first side wall covering material layers 4 on a side wall of the top mandrel layer 3 are merged together in the second region II.

Figure 2:
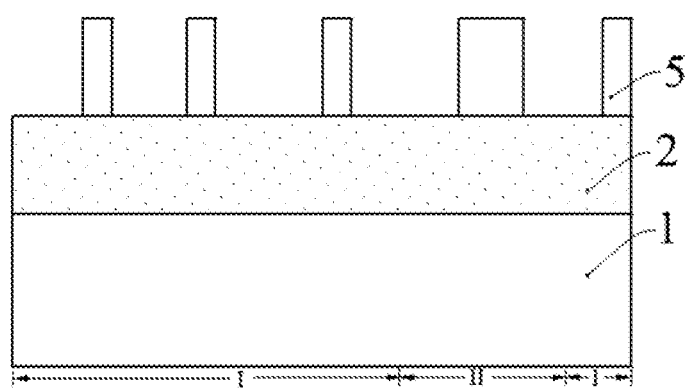

As shown in FIG. 2, the first side wall covering material layer 4 on a top portion of the top mandrel layer 3 and on a surface of the substrate 1 in the first region are removed, and the remaining first side wall covering material layer 4 located on a side wall of the top mandrel layer 3 serves as a first side wall covering layer 5. The top mandrel layer 3 is removed after the first side wall covering layer 5 is formed (as shown in FIG. 1).

Figure 3:
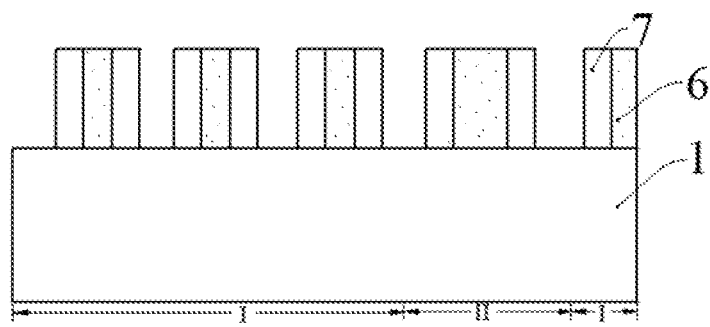

As shown in FIG. 3, the bottom mandrel material layer 2 is etched using the first side wall covering layer 5 as a mask to form a bottom mandrel layer 6. The bottom mandrel layers 6 and the substrate 1 exposed by the bottom mandrel layer 6 are conformally covered with a second side wall covering material layer (not shown). Then, the second side wall covering material layer on a top surface of the bottom mandrel layer 6 and the surface of the substrate 1 are removed, and the remaining second side wall covering material layer located on a side wall of the bottom mandrel layer 6 serve as a second side wall covering layer 7.

Figure 4:
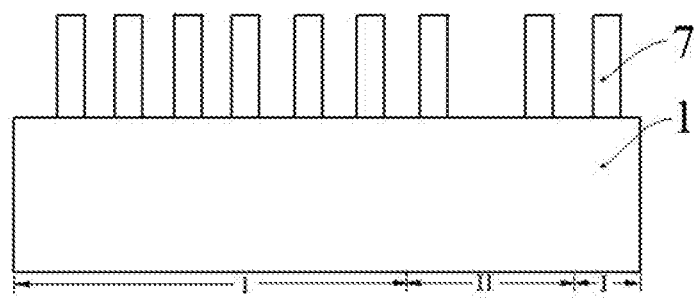

As shown in FIG. 4, the bottom mandrel layer 6 is removed.

Figure 5:
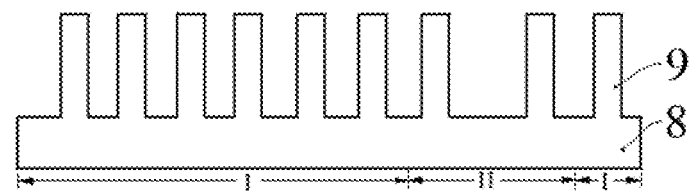

As shown in FIG. 5, the substrate 1 is etched using the second side wall covering layer 7 (as shown in FIG. 4) as a mask to form a substrate 8 and a desired pattern 9 located on the substrate 8.

In order to improve the integration of an integrated circuit, and improve the operating speed of the device and reduce the power consumption, the desired patterns 9 having various pitches are applied to a semiconductor structure. Furthermore, as the dimension of the semiconductor structure becomes smaller, since an extension direction perpendicular to the side wall of the top mandrel layer 3 is taken as a lateral direction, the lateral dimensions of the top mandrel layers 3 and the first side wall covering layer 5 are smaller and smaller. Therefore, it is more and more difficult to form the desired patterns 9 having the non-uniform pitches required by the process through the method of conformally covering with the sufficiently thick first side wall covering material layers 4 and merging the first side wall covering material layers 4 in the second region II together.

To address the foregoing problem, one form of the present disclosure provides a formation method of a semiconductor structure, including: proving a substrate; forming a plurality of discrete mandrel layers on the substrate, where a minimum pitch between the mandrel layers of the plurality of discrete mandrel layers is a second pitch, and a minimum pitch between each of other pitches is a first pitch; forming a first side wall covering layer on a side wall of the mandrel layer, and merging the first side wall covering layers formed between the mandrel layers having the second pitch together to form a second side wall covering layer; removing the first side wall covering layers, and maintaining the second side wall covering layers; forming a third side wall covering layer on an exposed side wall of the mandrel layer; removing the mandrel layer and the second side wall covering layer; and etching the substrate using the third side wall covering layer as a mask to form a desired pattern.

In one form of the present disclosure, the third side wall covering layer is an etching mask, and the mandrel layer and the second side wall covering layer are configured to define a pitch between the third side wall covering layers, thus defining a pitch of the etching masks. In one form of the present disclosure, an extension direction perpendicular to the side wall of the mandrel layer is a lateral direction. The pitch between the third side wall covering layers can be adjusted by changing the lateral dimensions of the mandrel layer and the second side wall covering layer according to process requirements. The substrate is etched using the third side wall covering layer as the mask, so that diversified desired patterns having non-uniform pitches are formed more easily, and further, the flexibility and the general applicability of the semiconductor structure are improved favorably.

In order to make the foregoing objects, features and advantages of the embodiment of the present disclosure more comprehensible, specific embodiments and implementations of the present disclosure are described in detail with reference to the accompanying drawings.

FIG. 6 to FIG. 16 illustrate schematic structural diagrams corresponding to various steps in one form of a formation method of a semiconductor structure according to the present disclosure.

Figure 6:
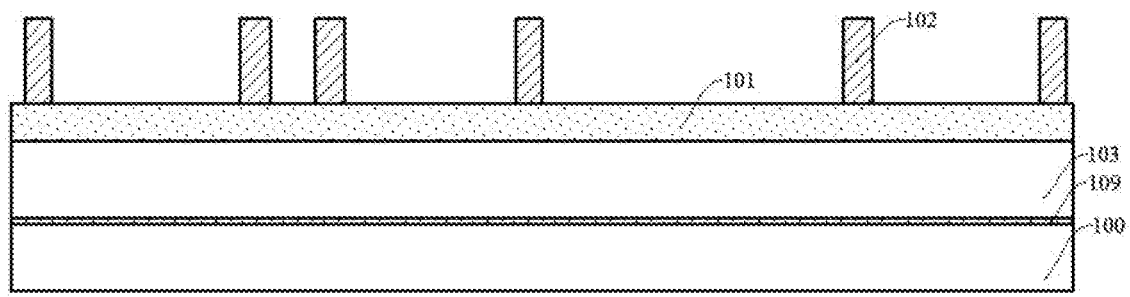
FIG. 6 to FIG. 16 illustrate schematic structural diagrams corresponding to various steps in one form of a formation method of a semiconductor structure according to the present disclosure.

Referring to FIG. 6, a substrate 100 is provided.

The substrate 100 provides a fundamental process for subsequent formation of desired patterns having non-uniform pitches.

In some implementations, a formed semiconductor structure being a fin field effect transistor (FET) is taken as an example. Correspondingly, in the subsequent process, the substrate 100 is configured to form a fin portion. In other embodiments and implementations, in the subsequent process, the substrate may also be configured to form a gate structure.

In some implementations, a material of the substrate 100 is silicon. In other embodiments and implementations, the material of the substrate may also be germanium, silicon carbide, polysilicon, amorphous silicon, gallium arsenide, or indium gallium.

In some implementations, after the substrate 100 is provided, the formation method of a semiconductor structure further includes: forming a mandrel material layer 103 on the substrate 100, and forming a plurality of discrete mandrel mask layers 102 on the mandrel material layer 103.

The mandrel material layer 103 makes preparation for the subsequent etching to form the mandrel layer.

Specifically, a material of the mandrel material layer 103 includes one or more of $SiO_2$, SiON, SiOC, silicon, amorphous silicon, SiN, amorphous silicon and metal oxide. In some implementations, the material of the mandrel material layer 103 is the amorphous silicon or silicon.

The mandrel mask layer 102 serves as an etching mask for etching the mandrel material layer 103 to form the mandrel layer.

In some implementations, the plurality of mandrel mask layers 102 are arranged at different pitches. Correspondingly, in the subsequent formation process, the mandrel material layer 103 is etched according to the mandrel mask layers 102 having the non-uniform pitches to form initial mandrel layers having the non-uniform pitches.

Specifically, a material of the mandrel mask layer 102 includes one or more of $SiO_2$, SiON, SiOC, and metal oxide. In some implementations, the material of the mandrel mask layers 102 includes SiN which is a low-cost dielectric material commonly used in process and has relatively high process compatibility, which is conducive to reducing the process difficulty and the process cost of forming the mandrel mask layer 102.

In some implementations, the mandrel mask layer 102 is formed using self-aligned double patterning (SADP). The specific steps of the SADP operation are omitted here. In some implementations, the mandrel mask layer may also be formed by using a SAQP operation. In some implementations, the mandrel mask layer may also be graphically formed.

It should be noted that after the substrate 100 is provided and before the mandrel material layer 103 is formed, the formation method of a semiconductor structure further includes: forming a substrate mask material layer 109 on the substrate 100.

In the subsequent process that the mandrel material layer 103 is etched using the mandrel mask layer 102 as a mask to form the mandrel layer, an etching rate of the mandrel material layer 103 is greater than an etching rate of the substrate mask material layer 109, and a top portion of the substrate mask material layer 109 serves as an etching stop position.

Specifically, a material of the substrate mask material layer 109 includes one or more of $SiO_2$, SiON, SiOC, and metal oxide. In some implementations, the material of the substrate mask material layer 109 includes SiON which is a low-cost dielectric material commonly used in the process and has relatively high process compatibility, which is conducive to reducing the process difficulty and the process cost of forming the substrate mask material layer 109.

It should be noted that after the mandrel material layer 103 is provided and before the mandrel mask layer 102 is formed, the formation method of a semiconductor structure further includes: forming an etching stop layer 101 on the mandrel material layer 103.

In the process that the mandrel mask layer 102 is formed by the etching process, an etching rate of the material of the mandrel mask layer 102 is greater than an etching rate of the etching stop layer 101, and a top portion of the etching stop layer 101 plays a role of stopping the etching to protect the mandrel material layer 103 from being easily m is-etched.

Specifically, a material of the etching stop layer 101 includes one or more of $SiO_2$, SiON, SiOC, and metal oxide. In some implementations, the material of the etching stop layer 101 includes SiON which is a low-cost dielectric material commonly used in process and has relatively high process compatibility, which is conducive to reducing the process difficulty and the process cost of forming the etching stop layer 101.

Figure 7:
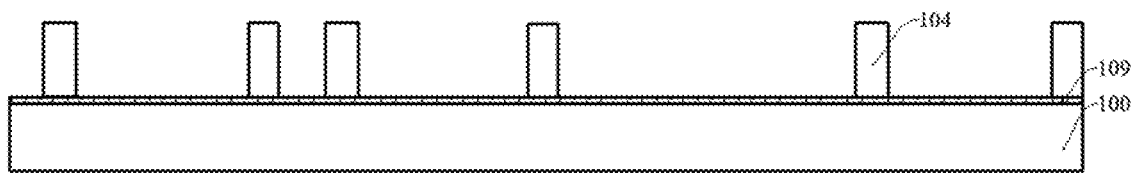
Figure 8:
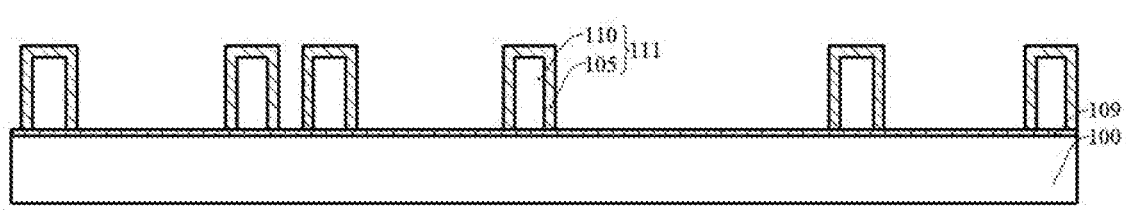

Referring to FIG. 7 and FIG. 8, a plurality of discrete mandrel layers 111 (as shown in FIG. 8) are formed on the substrate 100. A minimum pitch between the plurality of mandrel layers 111 is a second pitch, and each of other pitches is a first pitch.

First side wall covering layers subsequently formed between the second pitches are merged together to form a second side wall covering layer, and the second pitch between the mandrel layers 111 provides a process space for the subsequent formation of the second side wall covering layer.

The dimension of the second pitch is set according to specific process requirements. On the surface of the substrate 100, an extension direction perpendicular to the side wall of the mandrel layer 111 is a lateral direction. If the second pitch is too large, a lateral dimension of the second side wall covering layer formed in the second pitch is correspondingly too large, which easily causes that the dimension between third side wall covering layers subsequently formed according to the mandrel layers 111 having the second pitch is too large and correspondingly causes that the positions of the third side wall covering layers formed according to the mandrel layers 111 having the second pitch do not meet the design requirements. If the second pitch is too small, the lateral dimension of the second side wall covering layer formed in the second pitch is correspondingly too small, which causes that the dimension between the third side wall covering layers subsequently formed according to the mandrel layers 111 having the second pitch is too small. In some implementations, a lateral dimension of the second pitch ranges from 20 nm to 50 nm, such as 25 nm, 35 nm and 45 nm.

A lateral dimension of the mandrel layer 111 is set according to specific process requirements. If the lateral dimension of the mandrel layer 111 is too large, it easily causes that the dimension between the third side wall covering layers subsequently formed according to the mandrel layers 111 having the second pitch is too large. If the lateral dimension of the mandrel layer 111 is too small, it easily causes that the dimension between the third side wall covering layers subsequently formed according to the mandrel layers 111 having the second pitch is too small. In some implementations, the lateral dimension of the mandrel layer 111 ranges from 15 nm to 50 nm, such as 20 nm, 30 nm and 40 nm.

In some implementations, the mandrel layer 111 includes a middle mandrel layer 110 and cladding layers 105 located on a top wall and a side wall of the middle mandrel layer 110.

The step of forming the mandrel layer 111 includes: as shown in FIG. 7, providing an initial mandrel layer 104; and as shown in FIG. 8, oxidizing a side wall and a top wall of the initial mandrel layer 104 to form an oxide layer. The oxide layer serves as the cladding layer 105, and the remaining initial mandrel layer 104 serves as the middle mandrel layer 110.

The cladding layer 105 is formed by oxidation. Therefore, the cladding layer 105 at all positions on the side wall of the initial mandrel layer 104 has good thickness uniformity, which is conducive to improving the formation quality of the cladding layer 105. In other implementations, the cladding layer may also be formed by an atomic layer deposition (ALD) process or a chemical vapor deposition (CVD) process.

In some implementations, the step of providing the initial mandrel layer 104 includes: etching the mandrel material layer 103 by using the mandrel mask layer 102 as the mask by a dry etching process to form the initial mandrel layer 104. The dry etching process has anisotropic etching characteristics and relatively good etching profile controllability, which is conducive to enabling the shape of the initial mandrel layer 104 to meet the process requirements. In addition, during etching of the mandrel material layer 103 by using the dry etching process, the substrate mask material layer 109 may be used as an etching stop layer.

Specifically, the oxidizing process includes a thermal oxidation process or an in-situ steam generation (ISSG) process. In some implementations, the ISSG process is used. By the use of the ISSG process, it is beneficial to making the uniformity of oxidation rates of the top wall and the side wall of the initial mandrel layer 104 higher, so that the cladding layer 105 has higher compactness and thickness uniformity. Furthermore, the process temperature of the ISSG process is generally low (the process temperature is usually lower than the process temperature of a furnace tube process), so that it is beneficial to reducing thermal stress, thereby reducing damage to the substrate mask material layer 109.

In some implementations, a material of the initial mandrel layer 104 includes one or two of silicon and amorphous silicon. Correspondingly, a material of the cladding layer 105 formed by oxidizing the side wall and the top wall of the initial mandrel layer 104 is silicon oxide.

It should be noted that the extension direction perpendicular to the side wall of the mandrel layers 111 is the lateral direction, and in the step of oxidizing the side wall and the top wall of the initial mandrel layer 104 to form the cladding layer 105, oxygen atoms would get into the side wall of the initial mandrel layer 104 and usually oxidize the initial mandrel layer 104 of 1 unit lateral dimension to form the cladding layer 105 of 1.1 to 1.3 unit lateral dimensions.

If the initial mandrel layer 104 of 1 unit lateral dimension is oxidized, and a lateral dimension of the formed cladding portion 105 is less than 1.1 units, the effect of increasing the lateral dimension of the mandrel layer 111 by oxidizing the initial mandrel layer 104 would not be obvious. If the initial mandrel layer 104 of 1 unit lateral dimension is oxidized, and the lateral dimension of the formed cladding portion 105 is more than 1.3 units, the process difficulty of the oxidation would be increased, resulting in extremely high difficulty in forming the cladding layer 105 by the oxidation and disadvantage of improving the formation efficiency of the cladding layer 105.

Subsequently, the third side wall covering layer is formed on the side wall of the mandrel layer 111. After the third side wall covering layer is formed, the formation method of a semiconductor structure further includes: removing the second side wall covering layer and the mandrel layer 111.

In embodiments and implementations of the present disclosure, by oxidizing the initial mandrel layer 104, the lateral dimension of the formed mandrel layer 111 is increased, which is conducive to slightly adjusting the pitch between the third side wall covering layers formed on the side walls of the mandrel layers 111 and is further conducive to enabling the third side wall covering layers formed according to the mandrel layers 111 having the second pitch to be more in line with the process requirements.

It should be noted that the cladding layer 105 should not be too thick or too thin. If the cladding layer 105 is too thick, i.e., during the oxidization of the side wall and the top wall of the initial mandrel layer 104, the material of the initial mandrel layers 104 of an excessive dimension are oxidized, the lateral direction of the mandrel layer 111 becomes too large, which can easily cause the cladding layers 105 on the side walls of the middle mandrel layers 110 having the minimum pitch to merge together. Correspondingly, if the cladding layer 105 between the middle mandrel layers 110 having the relatively small pitch is extremely thick, it can easily cause the subsequent removal of the relatively thick cladding layers 105 to have extremely high process difficulty. In addition, if the cladding layer 105 is too thick, it would cause the formation of the cladding layer 105 to have relatively high process difficulty. If the cladding layer 105 is too thin, the lateral dimension of the mandrel layer 110 is not increased significantly compared to the lateral dimension of the initial mandrel layer 104, and the pitch between the third side wall covering layers subsequently formed on the side walls of the mandrel layers 111 cannot be well adjusted. In some implementations, the thickness of the cladding layer 105 ranges from 2 nm to 5 nm, such as 3 nm and 4 nm.

Figure 9:
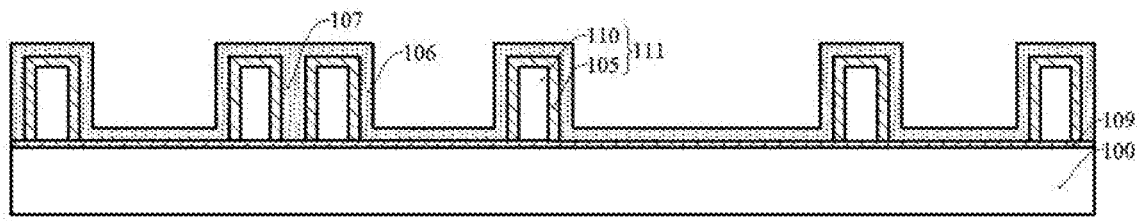

Referring to FIG. 9, the first side wall covering layer 106 is formed on the side wall of the mandrel layer 110, and the first side wall covering layers 106 formed between the mandrel layers 111 having the second pitch are merged together to form a second side wall covering layer 107.

The second side wall covering layer 107 fill a space between the mandrel layers 111 having the second pitch, so that in the subsequent formation of the third side wall covering layer, the third side wall covering layer is not easily located between the mandrel layers 111 having the second pitch.

A material of the first side wall covering layer 106 includes one or two of silicon and amorphous silicon. In some implementations, the material of the first side wall covering layer 106 is the same as that of the middle mandrel layer 110, so that the second side wall covering layer 107 and the middle mandrel layer 110 can be removed in one step subsequently, which is conducive to simplifying the subsequent formation process of the semiconductor structure.

The step of forming the first side wall covering layer 106 includes: conformally covering the mandrel layer 111 and the substrate 100 of a side portion of the mandrel layer 111 with a first side wall covering material layer (not marked). The first side wall covering material layer located on the side wall of the mandrel layer 111 serves as the first side wall covering layer 106.

In some implementations, double of a thickness dimension of the first side wall covering material layer is greater than the second pitch and less than the first pitch, so that the first side wall covering layer 106 can fill the space between the mandrel layers 111 having the second pitch.

In some implementations, the first side wall covering material layer is formed by using the ALD process. The ALD process includes ALD cycle performed multiple times, which is conducive to improving the thickness uniformity of the first side wall covering material layer, so that the thickness of the first side wall covering material layer can conformally cover the side wall of the mandrel layer 111, the top wall of the mandrel layer 111 and the substrate 100 of the side portion of the mandrel layer 111. In addition, the gap filling performance and the step coverage performance of the ALD process are good, and the conformal coverage performance of the first side wall covering material layer is correspondingly improved. In other implementations, the first side wall covering material layer may be also formed by using the CVD process.

Figure 10:
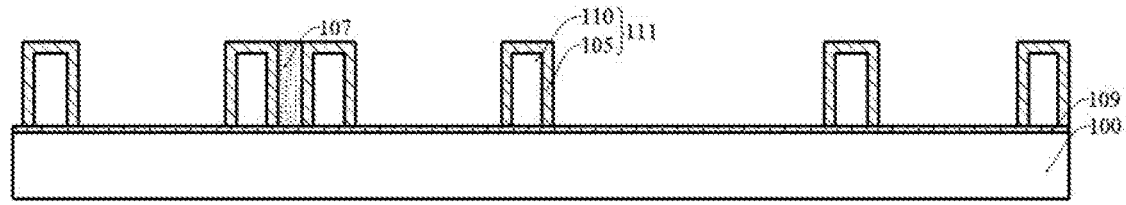

Referring to FIG. 10, the first side wall covering layer 106 is removed, and the second side wall covering layer 112 is maintained.

The first side wall covering layer 106 is removed, and the second side wall covering layer 112 is maintained to make preparation for the subsequent formation of the third side wall covering layer on the side wall of the mandrel layer 111 without the second side wall covering layer 107.

The step of removing the first side wall covering layer 106, and maintaining the second side wall covering layer 107 includes: etching the first side wall covering material layer by using the isotropic etching process to remove the first side wall covering material layer outside the mandrel layers 110 having the second pitch.

It should be noted that during the removal of the first side wall covering material layer, the first side wall covering layer 106 is removed.

Specifically, the isotropic etching process includes a wet etching process or an isotropic plasma etching process.

In some implementations, the first side wall covering material layer is etched by using the wet etching process, which has a high etching rate, easy operation, and low process cost. Using a low-concentration wet etching solution is also conducive to controlling a removal rate of the removed first side wall covering material layer. When the first side wall covering layer 106 on the side wall of the mandrel layer 111 is removed, the damage to the second side wall covering layer 107 is reduced.

In some implementations, the material of the first side wall covering layer 106 includes one or two of silicon or amorphous silicon, and the material of the substrate mask material layer 109 includes SiON. The wet etching solution is a tetramethylammonium hydroxide (TMAH) solution. An etching rate of the TMAH solution on the first side wall covering layer 106 is greater than an etching rate on the substrate mask material layer 109.

It should be noted that in other implementations, the first side wall covering material layer may also be etched using the isotropic plasma etching process. During the etching of the first side wall covering material layer using the isotropic plasma etching process, process parameters such as low bias power and high pressure intensity are selected, and plasmas in a chamber can achieve an isotropic etching effect.

It should be noted that during the removal of the first side wall covering layer 106, the substrate mask material layer 109 can protect the substrate 100.

Figure 11:
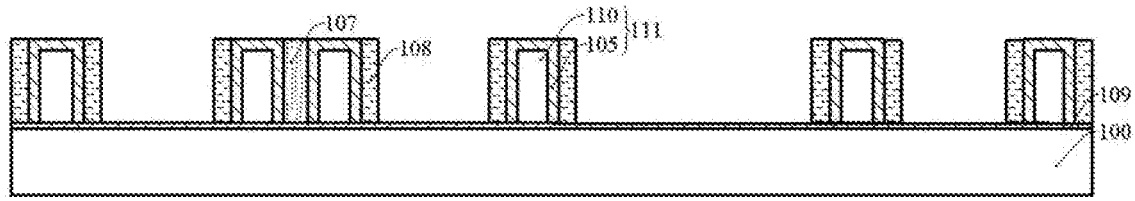

Referring to FIG. 11, after the first side wall covering layer 106 is removed, and the second side wall covering layer 107 is maintained, the third side wall covering layer 108 is formed on the exposed side wall of the mandrel layer 111.

In the subsequent process, the third side wall covering layer 108 serves as an etching mask for etching the substrate 100, and the mandrel layer 111 and the second side wall covering layer 107 are configured to define a pitch between the third side wall covering layers 108, thus defining a pitch of the etching masks. In some implementations of the present disclosure, the extension direction perpendicular to the side wall of the mandrel layer 111 is the lateral direction. The pitch between the third side wall covering layers 108 can be adjusted by changing the lateral dimensions of the mandrel layer 111 and the second side wall covering layer 107 according to the process requirements. The substrate 100 is etched using the third side wall covering layer 108 as the mask, so that diversified desired patterns having non-uniform pitches are formed more easily, and further, the flexibility and the general applicability of the semiconductor structure are improved favorably.

In the subsequent removal of the mandrel layer 111 and the second side wall covering layer 107, an etching rate of the third side wall covering layer 108 is less than an etching rate of the mandrel layer 111 and the second side wall covering layer 107.

In some implementations, materials of the mandrel layers 111 and the second side wall covering layers 107 each include one or two of silicon and amorphous silicon. Correspondingly, a material of the third side wall covering layer 108 includes one or more of silicon nitride, silicon oxynitride, silicon carbide, nitrogen silicon carbide, boron nitride, silicon boron nitride and carbon silicon boron nitride.

The step of forming the third side wall covering layer 108 includes: conformally covering the mandrel layer 111, the second side wall 107, and the substrate 100 between the mandrel layer 111 and the second side wall covering layer 107 with a third side wall covering material layer (not shown); and removing the third side wall covering material layer on the top walls of the mandrel layers 111 and the second side wall covering layers 107 and on the substrate 100 between the mandrel layer 111 and the second side wall covering layer 107. The remaining third side wall covering material layer located on the side wall of the mandrel layer 111 serves as the third side wall covering layer 108.

In some implementations, the third side wall covering material layer is formed by using the ALD process. The ALD process includes ALD cycle performed multiple times, which is conducive to improving the thickness uniformity, the gap filling performance and the step coverage performance of the third side wall covering material layer, so that the conformal coverage performance of the third side wall covering material layer is improved, and the third side wall covering material layer can conformally cover the side wall of the mandrel layer 111, the second side wall covering layer, the top wall of the mandrel layer 111, and the substrate 100 of the side portion of the mandrel layer 111 and the second side wall covering layer 107. In other implementations, the third side wall covering material layer may be also formed by using the CVD process.

In some implementations, the third side wall covering material layer on the top walls of the mandrel layer 111 and the second side wall covering layer 107, and on the substrate 100 between the mandrel layer 111 is removed by using the dry etching process. The dry etching process has anisotropic etching characteristics and relatively good etching profile controllability, so that the damage to the third side wall covering material layer on the side wall of the mandrel layer 111 is relatively small while the third side wall covering material layer on the top walls of the second side wall covering layers 107 and the mandrel layer 111 and on the substrate 100 is removed, and the formed third side wall covering layer 108 has relatively good profile.

On the surface of the substrate 100, by taking the extension direction perpendicular to the side wall of the mandrel layer 111 as the lateral direction, a lateral dimension of the third side wall covering layer 108 is set according to actual process requirements. If the lateral dimension of the third side wall covering layer 108 is too large, it easily causes the lateral dimension of the desired pattern subsequently formed by etching the substrate 100 with the third side wall covering layer 108 serving as the mask to be too large. If the lateral dimension of the third side wall covering layer 108 is too large, it easily causes the lateral dimension of the desired pattern subsequently formed by etching the substrate 100 with the third side wall covering layer 108 serving as the mask to be too small. In some implementations, the lateral dimension of the third side wall covering layer 108 ranges from 4 nm to 30 nm, such as 5 nm, 10 nm and 20 nm.

Referring to FIG. 12 to FIG. 15, after the third side wall covering layer 108 is formed, the mandrel layer 111 and the second side wall covering layer 107 are removed.

The mandrel layer 111 and the second side wall covering layer 107 are removed to make preparation for the subsequent etching of the substrate 100 with the third side wall covering layer 108 serving as the mask to form the desired pattern.

Figure 12:
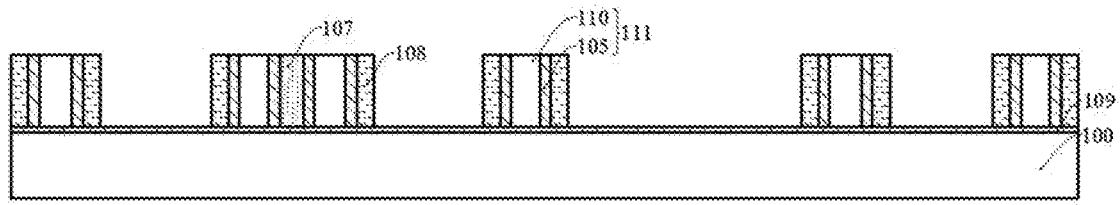

Specifically, the step of removing the mandrel layer 111 and the second side wall covering layer 107 includes: as shown in FIG. 12, removing the cladding layer 105 on the top wall of the middle mandrel layer 110.

The cladding layer 105 on the top wall of the middle mandrel layer 110 is removed to expose the middle mandrel layer 110 to make preparation for the subsequent one-step removal of the middle mandrel layer 110 and the second side wall covering layer 107.

In some implementations, the cladding layer 105 on the top wall of the middle mandrel layer 110 is removed using the dry etching process. The dry etching process has the anisotropic etching characteristics, so that damage to the side wall of the third side wall covering layer 108 can be laterally reduced in the step of removing the cladding layer 105 on the top wall of the middle mandrel layer 110. In other implementations, the cladding layer on the top wall of the middle mandrel layer is removed by using a wet etching solution.

In some implementations, a material of the cladding layer 105 is silicon oxide. Correspondingly, etching gas for removing the cladding layer 105 on the top wall of the middle mandrel layer 110 includes hydrogen fluoride gas.

Figure 13:
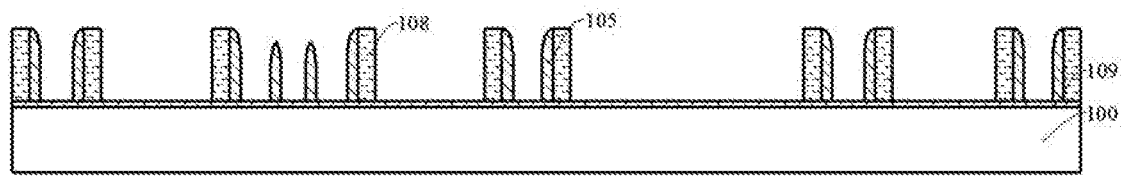

As shown in FIG. 13, after the cladding layer 105 on the top wall of the middle mandrel layers 110 is removed, the middle mandrel layer 110 and the second side wall covering layer 107 are removed by using the dry etching process.

Generally, the lateral dimensions of the middle mandrel layer 110 and the second side wall covering layer 107 are greater than the thickness of the cladding layer 105. During dry etching, a projection area of the middle mandrel layer 110 and the second side wall covering layer 107 on the substrate 100 is larger than a projection area of the cladding layer 105 on the substrate. Therefore, the difficulty in firstly removing the middle mandrel layer 110 and the second side wall covering layer 107 is lower than the difficulty in firstly removing the remaining cladding layer 105.

In some implementations, the middle mandrel layer 110 and the second side wall covering layer 107 are removed using the dry etching process. In the foregoing, the cladding layer 105 on the top wall of the middle mandrel layer 110 is also removed using the dry etching process. Therefore, removal of the middle mandrel layer 110 and the second side wall covering layer 107 and removal of the cladding layer 105 on the top wall of the middle mandrel layer 110 may be performed in a same reaction chamber by replacing etching gas, and the process steps can be simplified.

In some implementations, the materials of the middle mandrel layer 110 and the second side wall covering layer 107 include one or two of silicon and amorphous silicon. Correspondingly, in the step of removing the middle mandrel layer and the second side wall covering layer using the dry etching process, the etching gas used includes $NF_3$ and $H_2$.

It should be noted that during the removal of the middle mandrel layer 110 and the second side wall covering layer 107, the remaining cladding layer 105 is also etched, and the damage extent of the cladding layer 105 originally on the side wall of the second side wall covering layer 107 is usually greater than the damage extent of the cladding layer 105 on the side wall of the third side wall covering layer 108.

Figure 14:
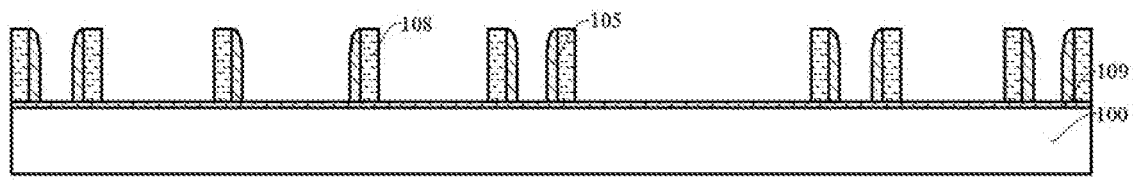
Figure 15:
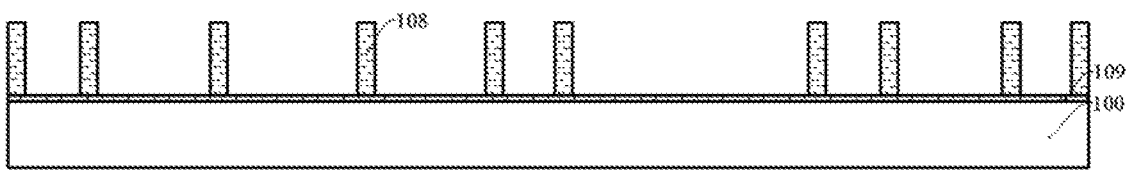

As shown in FIG. 14 and FIG. 15, after the middle mandrel layer 110 and the second side wall covering layer 107 are removed, the remaining cladding layer 105 is removed.

The remaining cladding layer 105 is removed to make preparation for the subsequent etching of the substrate 100 with the third side wall covering layer 108 serving as the mask to form the desired pattern.

In some implementations, the remaining cladding layer 105 is removed using the wet etching process. Specifically, the wet etching solution is a hydrogen fluoride solution.

It should be noted that the cladding layer 105 on the side wall of the second side wall covering layer 107 (as shown in FIG. 12) is removed at first, and the cladding layer 105 on the side wall of the third side wall covering layer 108 is removed later.

Figure 16:
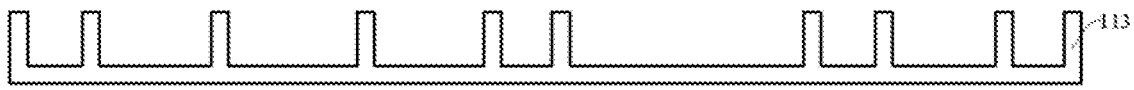

Referring to FIG. 16, after the mandrel layer 111 and the second side wall covering layer 107 are removed, the substrate 100 is etched with the third side wall covering layer 108 serving as the mask to form the desired pattern 113.

It should be noted that in the process that the substrate 100 is etched with the third side wall covering layer 108 serving as the mask to form the desired pattern 113, the third side wall covering layer 108 also etches the substrate mask material layer 109 to form a substrate mask layer (not shown).

In some implementations, the substrate 100 is etched with the third side wall covering layer 108 serving as the mask using dry etching to form the desired pattern 113. The dry etching process has anisotropic etching characteristics and relatively good etching profile controllability, which is conducive to enabling the shape of the desired pattern 113 to meet the process requirements and is also conductive to improving the removal efficiency of the substrate 100. Etching the substrate 100 using the dry etching process is conducive to accurately controlling a height of the desired pattern 113. Furthermore, various film layers may be etched in same etching equipment by replacing the etching gas, so that the process steps are simplified.

Correspondingly, an implementation of the present disclosure further provides a semiconductor structure. Referring to FIG. 11, a schematic structural diagram of one form of a semiconductor structure of the present disclosure is illustrated.

The semiconductor structure includes: a substrate 100; a plurality of mandrel layers 111, discretely disposed on the substrate 100, where a minimum pitch between the plurality of mandrel layers 111 is a second pitch, and each of other pitches is a first pitch; a second side wall covering layer 107, filling a space between the mandrel layers 111 having the second pitch; and a third side wall covering layer 108, located on the side wall of the mandrel layer 111.

In a semiconductor structure provided by one form of the present disclosure, the third side wall covering layer 108 is an etching mask for subsequently etching the substrate 100, and the mandrel layer 111 and the second side wall covering layer 107 are configured to define a pitch between the third side wall covering layer 108, thus defining a pitch of the etching masks. An extension direction perpendicular to the side wall of the mandrel layer 111 is a lateral direction. The pitch between the third side wall covering layers 108 can be adjusted by changing lateral dimensions of the mandrel layer 111 and the second side wall covering layer 107 according to the process requirements. After the mandrel layer 111 and the second side wall covering layer 107 are subsequently removed, the substrate 100 is etched with the third side wall covering layer 108 serving as a mask, so that diversified desired patterns having non-uniform pitches are formed easily, and further, the flexibility and the general applicability of the semiconductor structure are improved favorably.

The substrate 100 provides a fundamental process for subsequent formation of desired patterns having non-uniform pitches.

In some implementations, a formed semiconductor structure being a fin field effect transistor (FET) is taken as an example. Correspondingly, in the subsequent process, the substrate 100 is configured to form a fin portion. In other implementations, in the subsequent process, the substrate may also be configured to form a gate structure.

In some implementations, a material of the substrate 100 is silicon. In other implementations, the material of the substrate may also be germanium, silicon carbide, polysilicon, amorphous silicon, gallium arsenide, or indium gallium.

In some implementations, a side wall of the second side wall covering layer 107 is in contact with the side wall of the mandrel layer 111. That is, the second pitch is equal to the lateral dimension of the second side wall covering layer 107.

The mandrel layer 111 and the second side wall covering layer 107 are configured to define the pitch between the third side wall covering layers 108 on the side walls of the mandrel layers 111.

It should be noted that a dimension of the second pitch is set according to specific process requirements. On a surface of the substrate 100, the extension direction perpendicular to the side wall of the mandrel layer 111 is the lateral direction. If the second pitch is too large, the lateral dimension of the second side wall covering layer is correspondingly too large, which can easily cause a dimensions between the third side wall covering layers 108 on the side walls of the mandrel layers 111 having the second pitch to be too large, and correspondingly causes positions of the third side wall covering layers 108 formed according to the mandrel layers 111 having the second pitch to not meet the design requirements. If the second pitch is too small, the lateral dimension of the second side wall covering layer 107 is correspondingly too small, which easily causes that the dimension between the third side wall covering layers 108 on the side walls of the mandrel layers 111 having the second pitch is too small. In some implementations, the lateral dimension of the second pitch ranges from 20 nm to 50 nm, such as 25 nm, 35 nm and 45 nm.

The lateral dimension of the mandrel layer 111 is set according to specific process requirements. If the lateral dimension of the mandrel layer 111 is too large, it easily causes the dimension between the third side wall covering layers 108 on the side walls of the mandrel layers 111 having the second pitch to be too large. If the lateral dimension of the mandrel layer 111 is too small, it easily causes the dimension between the third side wall covering layers 108 on the side walls of the mandrel layers 111 having the second pitch to be too small. In some implementations, the lateral dimension of the mandrel layer 111 ranges from 15 nm to 50 nm, such as 20 nm, 30 nm and 40 nm.

In some implementations, the mandrel layer 111 includes a middle mandrel layer 110 and cladding layers 105 located on a top wall and a side wall of the middle mandrel layer 110.

Specifically, a material of the middle mandrel layer 110 includes one or more of $SiO_2$, SiON, SiOC, silicon, amorphous silicon, SiN, amorphous silicon and metal oxide. In some implementations, a material of the middle mandrel layer 110 includes one or two of silicon and amorphous silicon.

In one form of the present disclosure, the cladding layer 105 is formed by oxidizing the initial mandrel layer 104 (as shown in FIG. 7). In the process of oxidizing the initial mandrel layer 104 to form the mandrel layer 111, oxygen atoms would get into the side wall of the initial mandrel layer 104, so that the lateral dimension of the mandrel layer 111 is larger than that of the initial mandrel layer 104.

The cladding layer 105 is formed by oxidation. Therefore, the cladding layer 105 at all positions of the side wall of the initial mandrel layer 104 has good thickness uniformity, which is conducive to improving the formation quality of the cladding layer 105.

By oxidizing the initial mandrel layer 104, the lateral dimension of the formed mandrel layer 111 is increased, which is conducive to slightly adjusting the pitch between the third side wall covering layers 108 formed on the side walls of the mandrel layers 111 and is further conducive to enabling the third side wall covering layer 108 formed according to the mandrel layers 111 having the second pitch to be more in line with the process requirements.

A material of the cladding layer 105 is silicon oxide. The silicon oxide is a low-cost dielectric material commonly used in process and has relatively high process compatibility, which is conducive to reducing the process difficulty and the process cost of forming the cladding layers 105.

It should be noted that the cladding layer 105 should not be too thick or too thin. If the cladding layer 105 is too thick, it would occupy excessive lateral space of the second side wall covering layer 107, and in the subsequent removal of the cladding layer 105 on the top portion of the middle mandrel layer 110, and the middle mandrel layer 110 and the second side wall covering layer 107, it can easily cause extremely high process difficulty in removing the relatively thick cladding layer 105. In addition, if the cladding layer 105 is too thick, it can easily cause the formation of the cladding layer 105 to have relatively high process difficulty. If the cladding layer 105 is too thin, the lateral dimension of the mandrel layer 110 is not increased significantly compared to the lateral dimension of the initial mandrel layer 104. In some implementations, a thickness of the cladding layer 105 ranges from 2 nm to 5 nm, such as 3 nm and 4 nm.

A material of the first side wall covering layer 107 includes at least one of silicon or amorphous silicon. In some implementations, the material of the second side wall covering layer 107 is the same as that of the middle mandrel layer 110, so that the second side wall covering layer 107 and the middle mandrel layer 110 can be removed in one step subsequently, which is conducive to simplifying the subsequent formation process of the semiconductor structure.

The third side wall covering layer 108 serves as an etching mask for etching the substrate 100 to form a desired pattern.

In the subsequent removal of the mandrel layer 111 and the second side wall covering layer 107, an etching rate of the third side wall covering layer 108 is less than an etching rate of the mandrel layer 111 and the second side wall covering layer 107.

In some implementations, materials of the mandrel layer 111 and the second side wall covering layer 107 each include one or two of silicon and amorphous silicon. Correspondingly, a material of the third side wall covering layer 108 includes one or more of silicon nitride, silicon oxynitride, silicon carbide, nitrogen silicon carbide, boron nitride, silicon boron nitride and carbon silicon boron nitride.

On the surface of the substrate 100, by taking the extension direction perpendicular to the side wall of the mandrel layer 111 as the lateral direction, a lateral dimension of the third side wall covering layer 108 is set according to actual process requirements. If the lateral dimension of the third side wall covering layer 108 is too large, it can easily cause that a lateral dimension of the desired pattern subsequently formed by etching the substrate 100 with the third side wall covering layer 108 serving as the mask to be too large. If the lateral dimension of the third side wall covering layer 108 is too large, it can easily causes the lateral dimension of the desired pattern subsequently formed by etching the substrate 100 with the third side wall covering layer 108 serving as the mask to be too small. In some implementations, the lateral dimension of the third side wall covering layer 108 ranges from 4 nm to 30 nm, such as 5 nm, 10 nm and 20 nm.

It should be noted that the semiconductor structure includes: a substrate mask material layer 109, located between the substrate 100 and a mandrel material layer 103.

In the subsequent removal of the mandrel layer 111 and the second side wall covering layer 107, the substrate mask material layer 109 serves as an etching stop layer, and the substrate mask material layer 109 can protect the substrate 100.

Specifically, a material of the substrate mask material layer 109 includes one or more of $SiO_2$, SiON, SiOC, and metal oxide. In some implementations, the material of the substrate mask material layer 109 includes SiON which is a low-cost dielectric material commonly used in the process and has relatively high process compatibility, which is conducive to reducing the process difficulty and the process cost of forming the substrate mask material layer 109.

The semiconductor structure of implementations described above may be formed by the formation method of the foregoing embodiments and implementations, and may also be formed by other formation methods. Specific descriptions of the semiconductor of the present embodiments and implementations may refer to the corresponding descriptions in the foregoing embodiment, and descriptions of the present embodiment are omitted here.

Although the present disclosure is disclosed as above, the present disclosure is not limited thereto. A person skilled in the art may make variations and modifications without departing from the spirit and scope of the present disclosure. Therefore, the protection scope of the present disclosure should be subject to the claims.

What is claimed is:

1. A formation method of a semiconductor structure, comprising:
   providing a substrate;
   forming a plurality of discrete mandrel layers on the substrate, wherein a minimum pitch between the mandrel layers of the plurality of mandrel layers is a second pitch;
   forming a first side wall covering layer on a side wall of each mandrel layer of the plurality of mandrel layers, and merging the first side wall covering layers formed between the mandrel layers of the plurality of mandrel layers having the second pitch together to form a second side wall covering layer;
   removing the first side wall covering layer, and maintaining the second side wall covering layer;
   forming a third side wall covering layer on the exposed side wall of each mandrel layer of the plurality of mandrel layers;
   removing the plurality of mandrel layers and the second side wall covering layer;

etching the substrate using the third side wall covering layer as a mask to form a desired pattern.

2. The formation method of the semiconductor structure according to claim 1, wherein each mandrel layer of the plurality of mandrel layers comprises a middle mandrel layer and cladding layers located on a top wall and a side wall of the middle mandrel layer.

3. The formation method of the semiconductor structure according to claim 2, wherein a thickness of the cladding layers ranges from 2 nm to 5 nm.

4. The formation method of the semiconductor structure according to claim 2, wherein materials of the middle mandrel layer and the second side wall covering layer each comprise one or two of silicon and amorphous silicon.

5. The formation method of the semiconductor structure according to claim 2, wherein forming each mandrel layer of the plurality of mandrel layers comprises:
providing an initial mandrel layer;
oxidizing a side wall and a top wall of the initial mandrel layer to form an oxide layer, wherein the oxide layer serves as the cladding layers, and the remaining initial mandrel layer serves as the middle mandrel layer.

6. The formation method of the semiconductor structure according to claim 5, wherein for each mandrel layer of the plurality of mandrel layers:
an extension direction perpendicular to the side wall of the mandrel layer is a lateral direction; and
in the step of oxidizing the side wall and the top wall of the initial mandrel layer to form the cladding layers, the initial mandrel layer of one (1) unit lateral dimension is oxidized to form the cladding layers of 1.1 to 1.3 unit lateral dimension.

7. The formation method of the semiconductor structure according to claim 5, wherein oxidizing the side wall and the top wall of the initial mandrel layer comprises a thermal oxidation process or an in-situ generation of steam process.

8. The formation method of the semiconductor structure according to claim 5, wherein a material of the cladding layers comprise silicon oxide.

9. The formation method of the semiconductor structure according to claim 5, wherein the step of removing the plurality of mandrel layers and the second side wall covering layer comprises for each mandrel layer:
removing the cladding layer on the top wall of the middle mandrel layer;
removing the middle mandrel layer and the second side wall covering layer by using a dry etching process after the cladding layer on the top wall of the middle mandrel layer is removed; and
removing the remaining cladding layer after the middle mandrel layer and the second side wall covering layer are removed.

10. The formation method of the semiconductor structure according to claim 9, wherein in the step of removing the middle mandrel layer and the second side wall covering layer by using the dry etching process, etching gas used comprises $NF_3$ and $H_2$.

11. The formation method of the semiconductor structure according to claim 1, wherein pitches between the mandrel layers of the plurality of mandrel layers other than the second pitch are first pitches,
the step of forming the first side wall covering layer comprises: conformally covering each mandrel layer of the plurality of mandrel layers and the substrate of a side portion of each mandrel layer with a first side wall covering material layer, where double of a thickness of the first side wall covering material layer is larger than the second pitch and less than the first pitches, and wherein the first side wall covering material layer located on the side wall of each mandrel layer serves as the first side wall covering layer; and
the step of removing the first side wall covering layer and maintaining the second side wall covering layer comprises: etching the first side wall covering material layer using an isotropic etching process to remove the first side wall covering material layer outside each mandrel layer having the second pitch.

12. The formation method of the semiconductor structure according to claim 11, wherein the isotropic etching process comprises a wet etching process or an isotropic plasma etching process.

13. The formation method of the semiconductor structure according to claim 1, wherein the step of forming the third side wall covering layer on the exposed side wall of the mandrel layers of the plurality of mandrel layers comprises:
conformally covering the plurality of mandrel layers, the second side wall covering layer, and the substrate between the plurality of mandrel layers and the second side wall covering layer with a third side wall covering material layer;
removing the third side wall covering material layer on top walls of the plurality of mandrel layers and the second side wall covering layer, and on the substrate between the plurality of mandrel layers, wherein the remaining third side wall covering material layer located on the side walls of the plurality of mandrel layers serves as the third side wall covering layer.

14. The formation method of the semiconductor structure according to claim 13, wherein the third side wall covering material layer is formed using a chemical vapor deposition process or an atomic layer deposition process.

15. The formation method of the semiconductor structure according to claim 1, wherein a material of the third side wall covering layer comprises at least one of silicon nitride, silicon oxynitride, silicon carbide, nitrogen silicon carbide, boron nitride, silicon boron nitride or carbon silicon boron nitride.

* * * * *